United States Patent
Park et al.

(10) Patent No.: US 8,885,402 B2
(45) Date of Patent: Nov. 11, 2014

(54) SEMICONDUCTOR INTEGRATED CIRCUIT SYSTEM AND METHOD FOR DRIVING THE SAME

(71) Applicant: SK Hynix Inc., Gyeonggi-do (KR)

(72) Inventors: Hae Chan Park, Gyeonggi-do (KR); Soo Gil Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/297,213

(22) Filed: Jun. 5, 2014

(65) Prior Publication Data

US 2014/0286089 A1    Sep. 25, 2014

Related U.S. Application Data

(62) Division of application No. 13/326,907, filed on Dec. 15, 2011, now Pat. No. 8,780,621.

(30) Foreign Application Priority Data

Sep. 26, 2011 (KR) .......................... 10-2011-0096809

(51) Int. Cl.
G11C 11/00 (2006.01)
G11C 13/00 (2006.01)

(52) U.S. Cl.
CPC .... G11C 13/0069 (2013.01); *G11C 2013/0092* (2013.01); *Y10S 977/754* (2013.01)
USPC ........................... 365/163; 365/148; 977/754

(58) Field of Classification Search
USPC ............ 365/46, 94, 100, 113, 129, 148, 163, 365/185.13–185.33, 189.07–189.12, 206, 365/222, 226, 230.03–230.06; 257/2–5, 9, 257/296, 310, E21.35, E31.047, E27.006; 438/29, 95, 96, 166, 135, 240, 259, 438/365, 482, 486, 597, 785; 977/754
See application file for complete search history.

(56) References Cited

U.S. PATENT DOCUMENTS

| | | | |
|---|---|---|---|
| 2007/0253242 A1* | 11/2007 | Parkinson et al. | 365/163 |
| 2010/0103726 A1* | 4/2010 | Bae et al. | 365/163 |
| 2010/0110782 A1* | 5/2010 | Parkinson et al. | 365/163 |
| 2010/0118593 A1* | 5/2010 | Cho et al. | 365/148 |
| 2010/0118595 A1* | 5/2010 | Bae et al. | 365/148 |
| 2011/0080775 A1* | 4/2011 | Bae et al. | 365/163 |

* cited by examiner

*Primary Examiner* — Harry W Byrne
(74) *Attorney, Agent, or Firm* — IP & T Group LLP

(57) ABSTRACT

A semiconductor integrated circuit system includes a phase-change line including a first phase-change area constituting a first memory cell and a second phase-change area constituting a second memory cell, a write current providing unit configured to phase-change a selected one of the first and second phase-change areas, and a phase-change compensation unit configured to restore the other of the first and second phase-change areas by compensating for a dummy phase-change caused in the other phase-change area due to a phase-change of the selected phase-change area.

9 Claims, 6 Drawing Sheets

SEMICONDUCTOR INTEGRATED CIRCUIT SYSTEM AND METHOD FOR DRIVING THE SAME

CROSS-REFERENCES TO RELATED APPLICATION

This application is a division of U.S. patent application Ser. No. 13/326,907 filed on Dec. 15, 2011, which claims priority under 35 U.S.C. 119(a) to Korean application number 10-2011-0096809, filed on Sep. 26, 2011. The disclosure of each of the foregoing application is incorporated by reference in its entirety as if set forth in full.

BACKGROUND OF THE INVENTION

1. Technical Field

Exemplary embodiments of the present invention relate to a semiconductor integrated circuit system and a method of driving the same, and more particularly, to a semiconductor integrated circuit system and a method of driving the same capable of reducing disturbance of a phase-change memory device.

2. Related Art

Semiconductor devices may be divided into a volatile memory device and a nonvolatile memory device depending on whether to retain storage data in power off. The volatile memory device includes dynamic random access memories (DRAMs) and static random access memories (SRAMs). The nonvolatile memory device includes flash memories and electrically erasable programmable read only memories (EEPROMs).

The flash memories which are nonvolatile memories have been mainly used in various electronic appliances such as digital cameras, portable phones, and MP3 players.

However, the flash memory devices take a relatively long time to read data therefrom and write data therein and thus new semiconductor devices such as magnetic random access memories (MRAMs), ferroelectric random access memories (FRAMs), and phase-change random access memories (PRAMs) are being developed to replace the flash memory devices.

The PRAM which is one of the alternative devices uses a phase-change material in which mutual phase-changes are caused between a crystalline state and an amorphous state by heat, as a storage medium. As the phase-change material, a chalcogenide compound consisting of germanium (Ge), antimony (Sb) and tellurium (Te), that is, a GST material may be used.

Current may be supplied to the phase-change material as a source for supplying heat and amount of the supplied heat depends on intensity and a supplying time of the current. The phase-change material has a different resistance depending on a crystalline state thereof and thus logic information of the phase-change material is determined by a resistance difference.

In the phase-change memory device, all a plurality of memory cells connected to the same bit line are connected to one phase-change line. Thus, when a write current is applied to a specific memory cell, unintended phase-change may be caused in a memory cell adjacent to the specific memory cell. Such phenomenon is referred to as disturbance. The disturbance may become serious when a reset current having a relatively high level is applied, which will be described with reference to FIG. 1 in more detail.

Referring to FIG. 1, a phase-change line 10 connected to first and second word lines WL1 and WL2 is provided. A portion of the phase-change line 10 which is connected to the first word line WL1 is to be phase-changed into an amorphous state and a portion of the phase-change line 10 which is connected to the second word line WL2 has been previously phase-changed into an amorphous state. Here, a in reference numeral 20 is a heat electrode for supplying heat to the phase-change line 10.

When a reset current I is applied to make the portion of the phase-change line 10 electrically connected to the word line WL1 to be in an amorphous state, the portion of the phase-change line connected to the second word line WL2 is also affected by the reset current I.

Thus, the portion of the phase-change line 10 which is connected to the second word line WL 2 may be phase-changed into a crystalline state again, thereby causing a read operation error.

SUMMARY

According to an exemplary aspect of an exemplary embodiment, a semiconductor integrated circuit system includes a memory cell array, a reset current unit, a set current unit, and a phase-change compensation unit. The memory cell array may include a plurality of word lines, a plurality of bit lines crossing the plurality of word lines, and a phase-change memory cell formed on each of intersections of the plurality of word lines and the plurality of bit lines. The reset current unit may be configured to apply a reset current to a bit line of the bit lines to control one selected from among the phase-change memory cells to have a amorphous state and the set current unit may be configured to apply a set current to a bit line of the bit lines to control one selected from the phase-change memory cells to have a crystalline state. The phase-change compensation unit may be configured to apply a correction current to a memory cell adjacent to each of the selected phase-change memory cells through a word line of the adjacent memory cell to compensate for a phase-change of the adjacent memory cell.

According to another exemplary aspect of an exemplary embodiment, a semiconductor integrated circuit system includes a phase-change line including a first phase-change area constituting a first memory cell and a second phase-change area constituting a second memory cell, a write current providing unit configured to phase-change a selected one of the first and second phase-change areas, and a phase-change compensation unit configured to restore the other of the first and second phase-change areas by compensating for a dummy phase-change caused in the other phase-change area due to a phase-change of the selected phase-change area.

According to still another exemplary aspect of an exemplary embodiment, a method of driving a semiconductor integrated circuit system includes phase-changing a selected memory cell area to a reset state, detecting a phase-change resistance of a memory cell area adjacent to the selected memory cell area on the same phase-change line, generating a correction current in response to a detection result of the phase-change resistance of the adjacent memory cell area, and maintaining a phase-change state of the adjacent memory cell area by applying the correct current to the adjacent memory cell area.

These and other features, aspects, and embodiments are described below in the section entitled "DESCRIPTION OF EXEMPLARY EMBODIMENT".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DESCRIPTION OF EXEMPLARY EMBODIMENT

Figure 1:
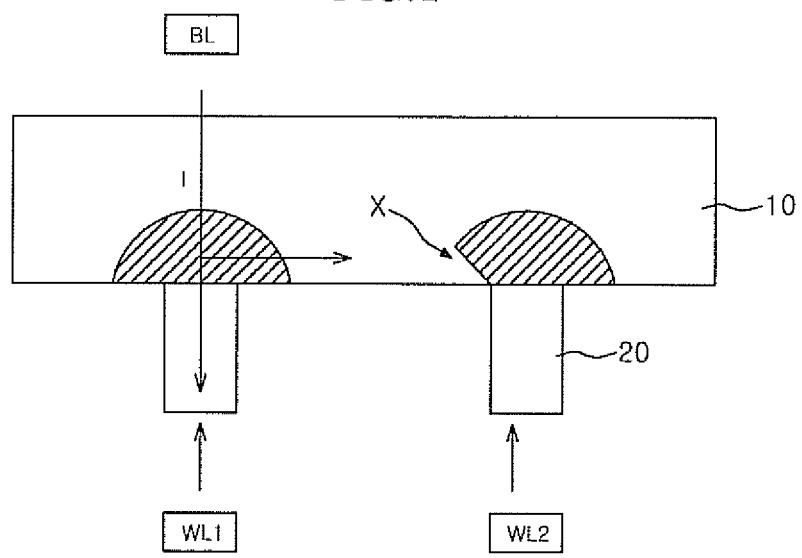
FIG. 1 is a cross-sectional view illustrating disturbance of a phase-change memory device in the related art.

Hereinafter, exemplary embodiments of the present invention are described in detail with reference to the accompanying drawings.

Exemplary embodiments are described herein with reference to cross-sectional views of exemplary embodiments (and intermediate structures). However, proportions and shapes illustrated in the drawings are exemplary only and may vary depending on various manufacturing techniques and/or design considerations. In part of the drawings, lengths and sizes of layers and regions of exemplary embodiments may be exaggerated for clarity in illustration. Throughout the drawings, like reference numerals denote like elements. Throughout the disclosure, when a layer is referred to as being "on" another layer or substrate, it can be directly on the other layer or substrate, or intervening layers may also be present.

Figure 2A:
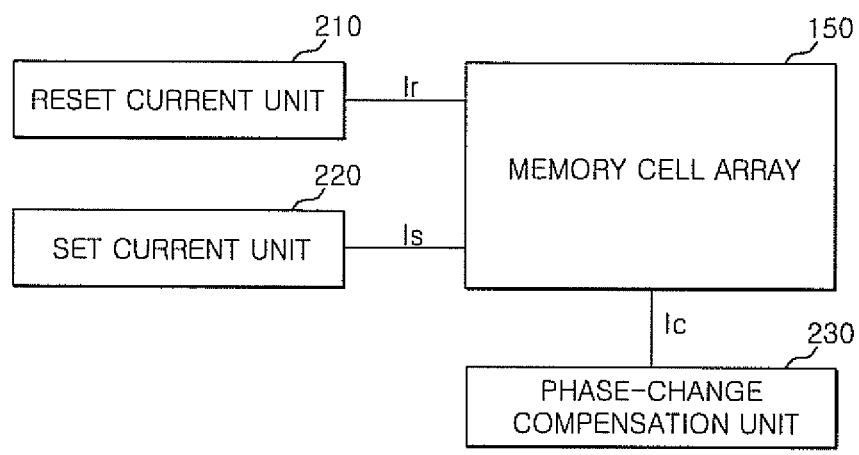
FIG. 2A is a block diagram illustrating a semiconductor integrated circuit system according to exemplary embodiments of the inventive concept.
Figure 2B:
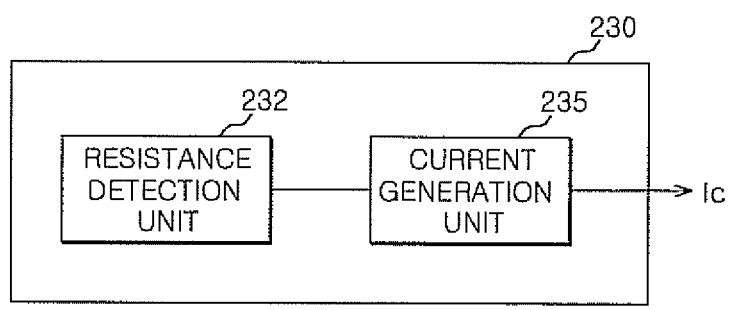
FIG. 2B is a detailed block diagram of a phase-change compensation unit according to exemplary embodiments of the inventive concept.

FIG. 2A is a schematic block diagram illustrating a semiconductor integrated circuit system according to exemplary embodiments and FIG. 2B is a block diagram illustrating a phase-change compensation unit according to exemplary embodiments. In the exemplary embodiments, for example, a semiconductor integrated circuit system applied to a phase-change memory device will be described.

Referring to FIG. 2A, the semiconductor integrated circuit system 100 includes a reset current unit 210, a set current unit 220, and a phase-change compensation unit 230 which provide currents to a memory cell array 150.

The reset current unit 210 and the set current unit 220 apply a reset current Ir and a set current Is to a bit line BL corresponding to a memory cell to be phase-changed, respectively as a write current. Thus, the reset current unit 210 and the set current unit 220 are referred to as a write current providing unit. As well-known, the reset current Ir is provided in a pulse type having a relatively high level and a sharp falling edge. Therefore, a temperature provided to a phase-change material falls sharply and thus a phase-change area of a phase-change material layer (PM of FIG. 4) is phase-changed to an amorphous state. On the other hand, the set current Is is provided in a pulse type having a relatively low level and a relatively gradual falling edge. Therefore, a temperature provided to the phase-change material falls gradually and the phase-change area of the phase-change material layer PM is phase-changed to a crystalline state.

The phase-change compensation unit 230 provides a correction current Ic to a word line corresponding to a memory cell adjacent to the memory cell to be phase-changed. Here, the adjacent memory cell denotes a memory cell which is connected to the same bit line with the selected memory cell and is selected by a word line positioned at either side of the word line corresponding to the selected memory cell. Thus, since a plurality of memory cells connected to the same bit line are connected to one phase-change line, the selected memory cell and the adjacent memory cell thereto are also connected to one phase-change line.

An amount of the correction current Ic is smaller than those of the reset current Ir and the set current Is so that the correction current Ic causes the phase-change in only a fine area in which an error has occurred.

As shown in FIG. 2B, the phase-change compensation unit 230 may include a resistance detection unit 232 configured to detect a resistance of a phase-change area of the adjacent memory cell, and a current generation unit 235 configured to determine an amount of the correction current in response to a detection result of the resistance detection unit 232.

The phase-change compensation unit 230 senses variation in a resistance of an adjacent memory cell (M2 of FIG. 4), calculates an area (size) in which an intended phase-change has occurred, generates a correction current adequate to restore the unintended phase-changed area, and provides the correction current to the memory cell array 150.

Figure 3:
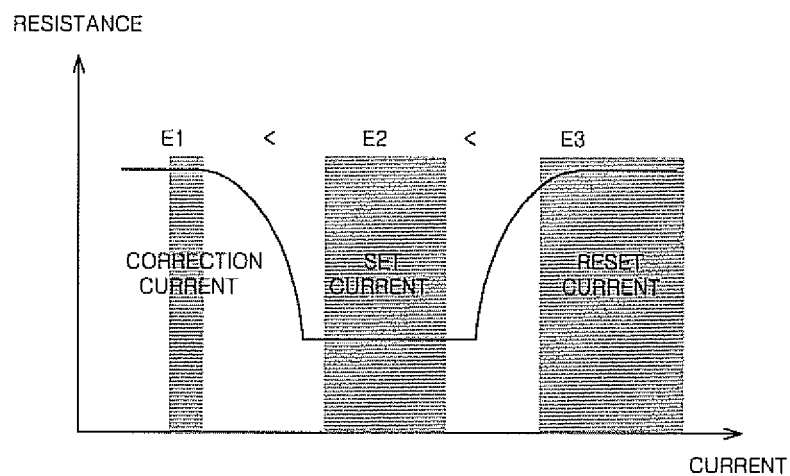
FIG. 3 is a graph representing a energy level and resistance distribution for each current applied to a semiconductor integrated circuit system according to exemplary embodiments of the inventive concept.

FIG. 3 is a graph representing energy levels of current applied to a phase-change layer and resistance distributions of the phase-change layer depending on the current in accordance with the exemplary embodiment of the present invention.

Figure 4:
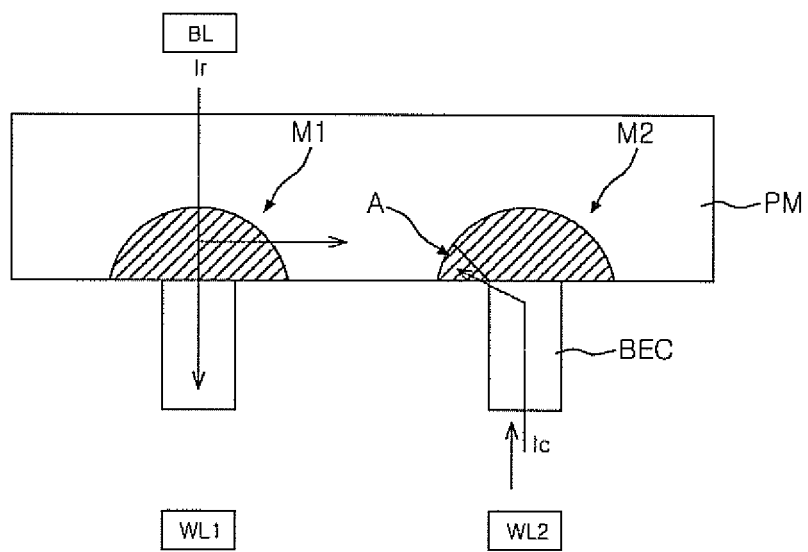
FIG. 4 is a cross-sectional view illustrating a driving mechanism of a semiconductor integrated circuit system according to an exemplary embodiment of the inventive concept.

Referring to FIG. 3, the correction current Ic, the set current Is, and the reset current Ir are designed to be greater in the order named in terms of energy levels and current sizes thereof. Further, the resistance distribution of an area to which the reset current Ir is provided is higher than that of an area to which the set current Is is provided. The resistance distribution of an area to which the correction current Ic is provided depends on the resistance distribution of the adjacent memory cell. For reference, FIG. 4 illustrates the case that the adjacent memory cell is in an amorphous state.

A mechanism of the semiconductor integrated circuit system will be described blow.

When a phase-change material is caused to be crystallized, since the set current has a relatively low level compared to the reset current, the adjacent memory cell is less affected by the set current. Therefore, in the exemplary embodiment, the case that a corresponding memory cell is to be changed into an amorphous state in which the disturbance may occurs, that is, the case that the reset current is provided will be described as an example.

First, the case that a selected memory cell (M1 of FIG. 4) is to be changed into an amorphous state and a memory cell (M2 of FIG. 4) adjacent to the selected memory cell M1 has been changed in an amorphous state will be described.

As shown in FIG. 4, the reset current Ir is applied to the selected memory cell M1 through a bit line BL of the selected memory cell M1. The selected memory cell M1 is properly phase-changed to an amorphous state by the reset current Ir.

At this time, a phase-change area of the memory cell M2 adjacent to the selected memory cell M1 may be unintentionally and partially phase-changed to a crystalline state due to disturbance of the reset current Ir. In FIG. 4, an "A" region is a portion which has been phase-changed to a crystalline state due to a disturbance effect.

To restore the "A" region to an original state (that is, an amorphous state), the correction current Ic is applied to the adjacent memory cell M2 through an adjacent word line WL2 (substantial disable state) connected to the "A" region. Thus, the "A" region of the adjacent memory cell M2 is phase-changed to be a normal state by the correction current Ic again, thereby being restored to the original amorphous state.

The unintentionally phase-changed region A of the adjacent memory cell M2 corresponds to a portion of the total phase-changed area and thus the unintentionally phase-changed region A may be corrected even when the size of the correction current is relatively small. Further, the correction current Ic is small in quantity compared to the reset current Ir and thus the correction current Ic do not cause the disturbance to the selected memory cell M1.

Here, the reference numeral BEC denotes a heat electrode.

Figure 5A:
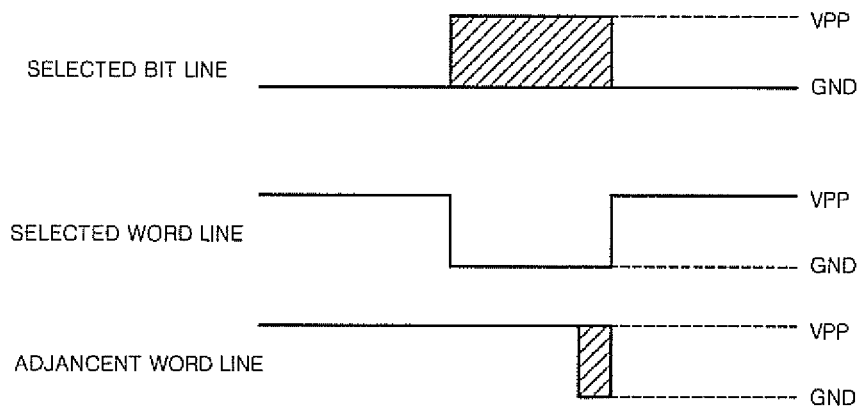
FIGS. 5A to 5D are correction current applying timing diagrams according to exemplary embodiment of the inventive concept.

As shown in FIG. 5A, the correction current Ic of a signal may be pulsed once within a write enable period (a period in which a selected word line and a selected bit line are all enabled) of the selected memory cell. A pulse width of the signal of the correction current Ic is smaller than an enable period of the selected bit line and an enable period of the selected word line.

Figure 5B:
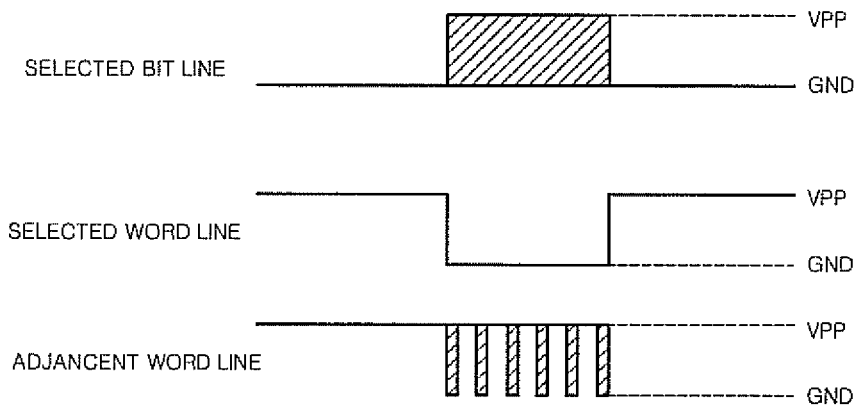

As shown in FIG. 5B, the correction current Ic of a signal may be pulsed several times in an enable period of the selected bit line and an enable period of the selected word line.

Figure 5C:
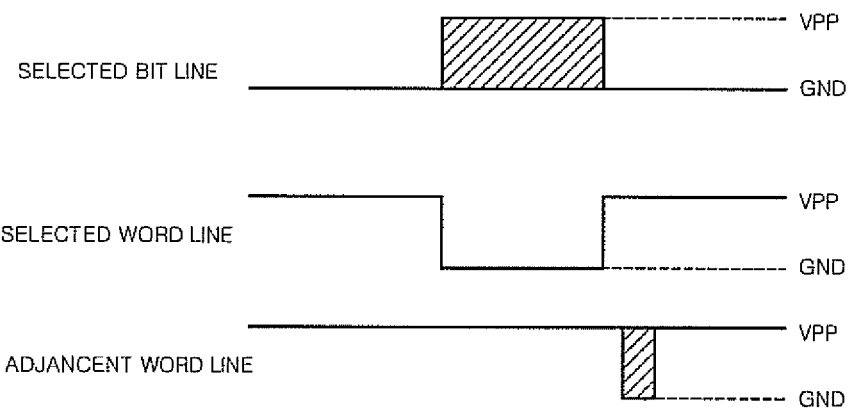
Figure 5D:
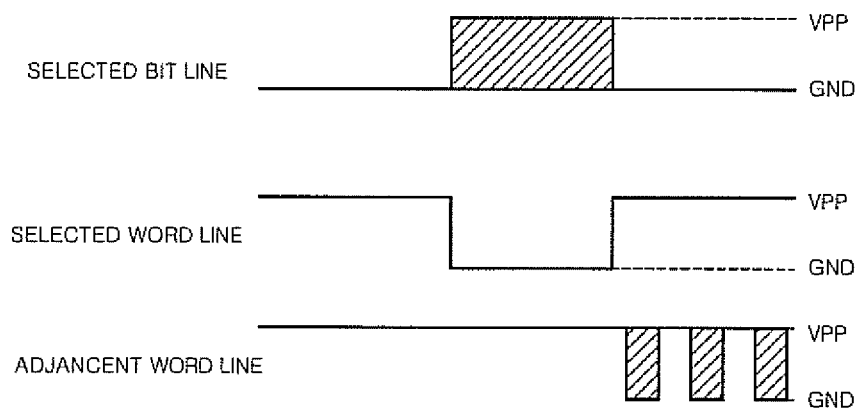

As shown in FIG. 5C, the correction current Ic of a signal may be pulsed once just after the enable periods of the selected bit line and the selected word line are ended and as shown in FIG. 5D, the correction current Ic of a signal may be pulsed several times just after the enable periods of the selected bit line and the selected word line are ended.

The pulsing type of the signal of the correct current Ic may be variously changed by considering a size of an unintentionally phase-changed area.

Next, the case that the selected memory cell M1 is to be changed into an amorphous state and the memory cell M2 adjacent to the selected memory cell M1 is in a crystalline state will be described.

Figure 6:
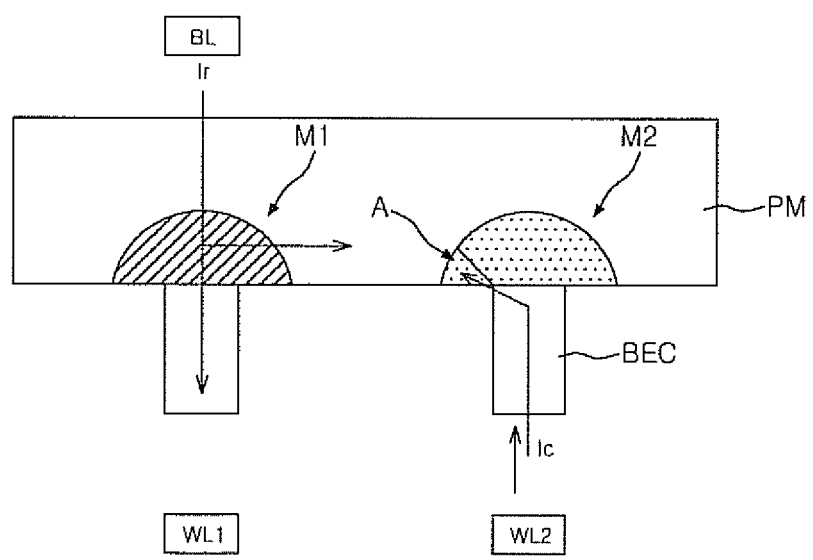
FIG. 6 is a cross-section view illustrating a driving mechanism of a semiconductor integrated circuit system according to another exemplary embodiment of the inventive concept.

As shown in FIG. 6, the reset current Ir is applied to the selected memory cell M1 through a bit line of the selected memory cell M1. Thus, the selected memory cell M1 is properly phase-changed to an amorphous state by the reset current Ir.

Meanwhile, a phase-change area of the adjacent memory cell M2 may be partially changed to an amorphous state due to a disturbance effect of the reset current Ir.

The correction current Ic is applied to the adjacent memory cell M2 through an adjacent word line WL2 connected to the "A" region to restore the "A" region to an original state. At this time, a level of the correction current for crystallization may be smaller than that of the above correction current Ic for amorphousness and a falling edge of the correction current Ic for crystallization may have a gradual slope like the set current. Thus, the "A" region of the adjacent memory cell M2 is phase-changed again, thereby being restored to an original crystalline state.

As described above in detail, according to the exemplary embodiments of the present invention, the correction current is applied to the adjacent memory cell affected by the disturbance through the adjacent word line in a write enable period of the selected memory cell, that is, within the enable periods of the selected bit line and the selected word line or just after the enable periods are ended, and an improperly phase-changed portion is restored to an original state. Therefore, a read operation error may be prevented from occurring.

While specific embodiments have been described above, they are exemplary only. Accordingly, the devices and methods as described herein should not be limited to the specific embodiments but should be broadly construed to include any other reasonably suitable devices and methods consistent with the above-described features of the exemplary embodiments.

What is claimed is:

1. A semiconductor integrated circuit system, comprising:
   a phase-change line including a first phase-change area constituting a first memory cell and a second phase-change area constituting a second memory cell;
   a write current providing unit configured to phase-change a selected one of the first and second phase-change areas; and
   a phase-change compensation unit configured to restore the other of the first and second phase-change areas by compensating for a dummy phase-change caused in the other phase-change area due to a phase-change of the selected phase-change area.

2. The semiconductor integrated circuit system of claim 1, wherein phase-change compensation unit is configured to provide a correction current to compensate for the dummy phase-change.

3. The semiconductor integrated circuit system of claim 2, wherein the write current providing unit includes:
   a reset current unit configured to provide a reset current to control the first and second phase-change areas to have an amorphous state; and
   a set current unit configured to provide a set current to control the first and second phase-change areas to have a crystalline state.

4. The semiconductor integrated circuit system of claim 3, wherein each of the first and second memory cells includes a word line and a bit line.

5. The semiconductor integrated circuit system of claim 4, wherein the set current and the reset current are provided to the bit line, and the correction current is provided through the word line.

6. The semiconductor integrated circuit system of claim 5, wherein the correction current has a smaller magnitude than the set current and the reset current.

7. The semiconductor integrated circuit system of claim 5, wherein the correction current is provided as a signal pulsed at least once within a write enable period of the one of the first and second memory cells.

8. The semiconductor integrated circuit system of claim 5, wherein the correction current is provided as a signal pulsed at least once immediately after a write enable period of the one of the first and second memory cells is terminated.

9. The semiconductor integrated circuit system of claim 2, wherein the phase-change compensation unit includes:
   a resistance detection unit configured to detect a resistance of the other of the first and second phase-change areas; and
   a current generation unit configured to determine an amount of the correction current in response to a detection result of the resistance detection unit.

* * * * *